(12) United States Patent
Chen et al.

(10) Patent No.: US 10,497,840 B2
(45) Date of Patent: Dec. 3, 2019

(54) WAVELENGTH-CONVERTING FILM AND LIGHT EMITTING DEVICE AND DISPLAY DEVICE USING THE SAME

(71) Applicant: Lextar Electronics Corporation, Hsinchu (TW)

(72) Inventors: Ching-Yi Chen, New Taipei (TW); Wen-Wan Tai, Kaohsiung (TW); Yu-Chun Lee, Zhubei (TW); Tzong-Liang Tsai, Taichung (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/793,026

(22) Filed: Oct. 25, 2017

(65) Prior Publication Data
US 2018/0122999 A1 May 3, 2018

(30) Foreign Application Priority Data

Oct. 28, 2016 (TW) .............................. 105135067 A

(51) Int. Cl.
*H01L 33/50* (2010.01)
*F21V 9/30* (2018.01)
(Continued)

(52) U.S. Cl.
CPC .......... *H01L 33/502* (2013.01); *C09K 11/727* (2013.01); *C09K 11/7774* (2013.01);
(Continued)

(58) Field of Classification Search
CPC ...... H01L 33/50; H01L 33/502; H01L 33/505
See application file for complete search history.

(56) References Cited

U.S. PATENT DOCUMENTS

| 5,433,888 A | 7/1995 | Okada et al. |
| 8,057,706 B1 | 11/2011 | Setlur et al. |
| (Continued) | | |

FOREIGN PATENT DOCUMENTS

| CN | 101705095 A | 5/2010 |
| CN | 101939857 A | 1/2011 |
| (Continued) | | |

OTHER PUBLICATIONS

Jiang, et al.: "A red phosphor BaTiF6:Mn4+: reaction mechanism, microstructures, optical properties, and applications for white LEDs†"; Dalton Trans., 2014, 43, 9414; This journal is © The Royal Society of Chemistry 2014; pp. D414-9418.
(Continued)

*Primary Examiner* — Jae Lee
(74) *Attorney, Agent, or Firm* — McClure, Qualey & Rodack, LLP

(57) ABSTRACT

A wavelength-converting film and a light emitting device and a display device using the same are disclosed. The wavelength converting film comprises a fluoride phosphor powder with a $Mn^{4+}$ as an activator, wherein the fluoride phosphor powder with the $Mn^{4+}$ as the activator comprises a sheet-like crystal and has a chemical formula of $A_2[MF_6]$: $Mn^{4+}$, wherein A is Li, Na, K, Rb, Cs, $NH_4$, or a combination thereof, and M is Ge, Si, Sn, Ti, Zr, or a combination thereof.

19 Claims, 11 Drawing Sheets

(51) Int. Cl.
  *C09K 11/72* (2006.01)
  *C09K 11/77* (2006.01)
  *H01L 33/00* (2010.01)
  *H01L 33/56* (2010.01)
  *F21K 9/64* (2016.01)
  *F21Y 115/10* (2016.01)
  *H01L 25/075* (2006.01)

(52) U.S. Cl.
  CPC ............ *F21V 9/30* (2018.02); *H01L 33/0095* (2013.01); *H01L 33/507* (2013.01); *H01L 33/56* (2013.01); *F21K 9/64* (2016.08); *F21Y 2115/10* (2016.08); *H01L 25/0753* (2013.01); *H01L 2224/32225* (2013.01); *H01L 2224/48091* (2013.01); *H01L 2224/48227* (2013.01); *H01L 2224/73265* (2013.01); *H01L 2924/12041* (2013.01)

(56) References Cited

U.S. PATENT DOCUMENTS

| | | | |
|---|---|---|---|
| 8,237,348 | B2 | 8/2012 | Masuda et al. |
| 8,252,613 | B1 | 8/2012 | Lyons et al. |
| 8,362,685 | B2 | 1/2013 | Masuda et al. |
| 8,491,816 | B2 | 7/2013 | Hong et al. |
| 8,974,696 | B2 | 3/2015 | Kaneyoshi et al. |
| 9,045,689 | B2 | 6/2015 | Zhang et al. |
| 9,422,471 | B2 | 8/2016 | Weiler et al. |
| 2010/0142189 | A1* | 6/2010 | Hong ............... C09K 11/616 362/97.3 |
| 2012/0161170 | A1 | 6/2012 | Dubuc et al. |
| 2012/0261704 | A1 | 10/2012 | Meyer et al. |
| 2015/0008463 | A1* | 1/2015 | Yoshida ............... C09K 11/675 257/98 |
| 2015/0091028 | A1 | 4/2015 | Lee et al. |

FOREIGN PATENT DOCUMENTS

| | | |
|---|---|---|
| CN | 102732249 A | 10/2012 |
| EP | 0479298 B1 | 8/1995 |
| EP | 2508586 A2 | 10/2012 |
| EP | 2663611 A1 | 11/2013 |
| TW | 201307527 A1 | 2/2013 |
| WO | WO2013088313 A1 | 6/2013 |
| WO | WO2013121355 A1 | 8/2013 |

OTHER PUBLICATIONS

Zhu, et al.: "Highly efficient non-rare-earth red emitting phosphor for warm white light-emitting diodes"; Received Jan. 29, 2014 | Accepted Jun. 6, 2014 | Published Jul. 8, 2014; pp. 1-11.

Lv, et al.: "Optimized photoluminescence of red phosphor K2TiF6:Mn4+ synthesized at room temperature and its formation mechanism"; Mater. Chem. C, 2015, 3, 1935; This journal is © The Royal Society of Chemistry 2015; pp. 1935-1941.

Takahashi, et al: "Mn4+-Activated Red Photoluminescence in K2SiF6 Phosphor"; Journal of the Electrochemical Society, 155; 12; E183-E188; 2008; pp. 1-6.

TIPO Office Action dated Mar. 22, 2017 in corresponding Taiwan application (No. 105135067).

TIPO Office Action dated Apr. 19, 2017 in Taiwan application (No. 105133722).

CN Office Action dated Mar. 8, 2019 in Chinese application (No. 201611005224.7).

* cited by examiner

WAVELENGTH-CONVERTING FILM AND LIGHT EMITTING DEVICE AND DISPLAY DEVICE USING THE SAME

This application claims the benefit Taiwan application Serial No. 105135067, filed Oct. 28, 2016, the subject matters of which are incorporated herein by reference.

BACKGROUND OF THE INVENTION

Field of the Invention

The invention relates in general to a wavelength converting film and a light emitting device and a display device using the same, and particularly relates to a wavelength converting film comprising a fluoride phosphor powder including a sheet-like crystal and a light emitting device and a display device using the same.

Description of the Related Art

A LED is a semiconductor element which generates light by releasing energy via the combination of holes and electrons. That is, to transform electric energy to optical energy. When a voltage is applied between a positive terminals and a negative terminal in a semiconductor, as current flows there through to combine electrons with holes, energy will be released out as light. The color of the light depends on the materials. Also, the energy level changes the color of the light. Further, when a positive voltage is applied, the LED can emit single-color light, discontinuous light, which is one of the photo-electric effects. The LED can emit near-ultraviolet light, visible light, or infrared light by changing the chemical composition of the semiconductor. To sum up, the LED is a new economical light source in the $21^{st}$ century and has advantages of high efficiency and long operation life, in comparison with the conventional light source.

Nowadays, various LED lamps appeared in the lighting market. However, it is still needed to improve the cost performance of the LED lamps and enhance the illumination effect of the LED lamps. A developing scheme focuses on a phosphor material that is used together with a light emitting diode chip. However, a conventional phosphor material has a low luminous efficiency and a large particle diameter, which limits an application for a device.

SUMMARY OF THE INVENTION

The present disclosure relates to a wavelength converting film and a light emitting device and a display device using the same.

According to a concept of the present disclosure, a wavelength converting film is provided. The wavelength converting film comprises a fluoride phosphor powder with a $Mn^{4+}$ as an activator. The fluoride phosphor powder with the $Mn^{4+}$ as the activator comprises a sheet-like crystal and has a chemical formula of $A_2[MF_6]:Mn^{4+}$. A is Li, Na, K, Rb, Cs, $NH_4$, or a combination thereof. M is Ge, Si, Sn, Ti, Zr, or a combination thereof.

According to another concept of the present disclosure, a light emitting device is provided. The light emitting device comprises a light emitting diode chip and a wavelength converting film. The wavelength converting film is capable of being excited by a first light emitted from the light emitting diode chip to emit a second light having a wavelength different from a wavelength of the first light. The wavelength converting film comprises a fluoride phosphor powder with a $Mn^{4+}$ as an activator. The fluoride phosphor powder with the $Mn^{4+}$ as the activator comprises a sheet-like crystal and has a chemical formula of $A_2[MF_6]:Mn^{4+}$. A is Li, Na, K, Rb, Cs, $NH_4$, or a combination thereof. M is Ge, Si, Sn, Ti, Zr, or a combination thereof.

According to yet another concept of the present disclosure, a display device is provided. The display device comprises a display panel and a light module. The light module is adjacent to the display panel. The light module comprises a light emitting diode chip and a wavelength converting film. The wavelength converting film is capable of being excited by a first light emitted from the light emitting diode chip to emit a second light having a wavelength different from a wavelength of the first light. The wavelength converting film comprises a fluoride phosphor powder with a $Mn^{4+}$ as an activator. The fluoride phosphor powder with the $Mn^{4+}$ as the activator comprises a sheet-like crystal and has a chemical formula of $A_2[MF_6]:Mn^{4+}$. A is Li, Na, K, Rb, Cs, $NH_4$, or a combination thereof. M is Ge, Si, Sn, Ti, Zr, or a combination thereof.

The above and other aspects of the invention will become better understood with regard to the following detailed description of the preferred but non-limiting embodiment (s). The following description is made with reference to the accompanying drawings.

DETAILED DESCRIPTION OF THE INVENTION

Figure 1:
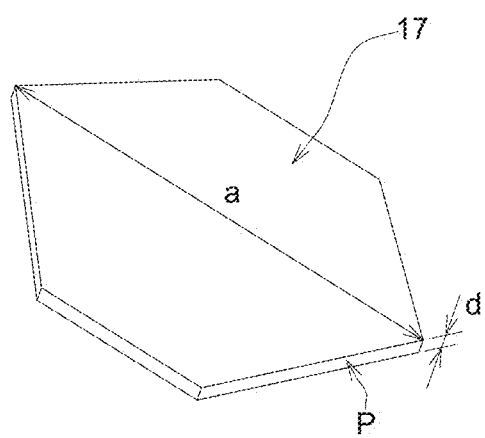
FIG. 1 illustrates a fluoride phosphor powder having a hexagon sheet-like crystal according to an embodiment.

Embodiments provide a fluoride phosphor powder and a manufacturing method and an application for the fluoride phosphor powder. The fluoride phosphor powder has an excellent luminous efficiency. In addition, the fluoride phosphor powder contains a sheet-like crystal having a thin thickness. Therefore, applying the fluoride phosphor powder in a device can improve a luminous efficiency of the device and facilitate miniaturizing a product.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

The fluoride phosphor powder is a fluoride phosphor powder with the $Mn^{4+}$ as an activator. The fluoride phosphor powder has a chemical formula of $A_2[MF_6]:Mn^{4+}$, and includes a sheet-like crystal, wherein the Mn element is a luminous center. The A element is Li, Na, K, Rb, Cs, $NH_4$ or a combination thereof. The M element is Ge, Si, Sn, Ti, Zr or a combination thereof. In an embodiment, for example, the fluoride phosphor powder has a chemical formula of $K_2[TiF_6]:Mn^{4+}$.

The sheet-like crystal of the fluoride phosphor powder has a thickness d and a crystal flat surface. The crystal flat surface may be perpendicular to a thickness direction. The crystal flat surface of the sheet-like crystal has a maximum length a. The maximum length a is defined as a distance between the two farthest end points on an edge of the crystal flat surface and farthest from each other. For example, the sheet-like crystal of the fluoride phosphor powder may have two the crystal flat surfaces substantially parallel to each other. A thickness d is defined between the two crystal flat surfaces. At least one of the two crystal flat surfaces has the maximum length a. In embodiments, $2.5 < a/d \leq 100$, such as $8 \leq a/d \leq 35$. For example, a=5-200 um. The fluoride phosphor powder according to embodiments emits a red light having a peak wavelength in a range of about 600 nm to about 650 nm after being excited by a light having a peak wavelength in a range of about 300 nm to about 470 nm. The fluoride phosphor powder having the sheet-like crystal according to embodiments have a good luminescent property such as good external quantum efficiency, and have a small size in the thickness. Therefore, arranging the sheet-like crystal of the fluoride phosphor powder with the thin thickness can miniaturize a product.

For example, FIG. 1 illustrates the fluoride phosphor powder according to embodiments. The sheet-like crystal 11 of the fluoride phosphor powder has a hexagon shape. In other words, the crystal flat surface 17 of the sheet-like crystal 11 has a hexagon shape. The sheet-like crystal 11 has the thickness d defined between the upper and lower crystal flat surfaces 17. The sheet-like crystal 11 has a sidewall surface P adjoined between the upper and lower flat crystal surfaces 17. In this embodiment, the crystal flat surface 17 has the maximum length a equal to the distance between the farthest two opposing corner points.

The crystal flat surface is not limited to the hexagon shape, and may be other polygonal shapes, such as a trilateral shape, a quadrilateral shape, a pentagon shape, etc.

In embodiments, the fluoride phosphor powder having the sheet-like crystal may be manufactured by a method comprising individually preparing a first solution an a second solution, then mixing the first solution with the second solution to obtain the fluoride phosphor powder having the sheet-like crystal.

The first solution comprises a precursor for the Mn and A elements. The A element comprises Li, Na, K, Rb, Cs, $NH_4$ or a combination thereof. In an embodiment, the precursor for the Mn and A elements is a fluoride, for example, comprising $KHF_2$, $K_2MnF_6$, etc. In embodiments, the first solution may further comprise a solvent, for example, comprising a HF solvent, etc. The HF solvent is capable of dissolving the Mn and A elements containing fluoride precursor for forming a stable solution, avoiding a degeneration by preventing the Mn and A elements containing fluoride precursor from a reaction.

The second solution comprises a polar solvent and a precursor for the M element. The M element comprises Ge, Si, Sn, Ti, Zr, or a combination thereof. In an embodiment, the precursor for the M element comprises an isopropyl alcoholate for the M element, for example, comprising titanium isopropoxide, etc. Using the polar solvent benefits an isotropic growth for the fluoride phosphor powder for forming the sheet-like crystal. The polar solvent comprises an alcohol solvent, for example, comprising methanol, ethanol, propanol, butanol, amyl alcohol, etc. In an embodiment, the polar solvent comprises 1-propanol.

In embodiments, a co-precipitation reaction occurs from the mixing the first solution and the second solution. The co-precipitation reaction forms the fluoride phosphor powder having the sheet-like crystal. In embodiments, after the mixing the first solution with the second solution, a washing step and a drying step may be performed to the fluoride phosphor powder including the sheet-like crystal to further purify and dry the fluoride phosphor powder.

The sheet-like crystal of the fluoride phosphor powder manufactured according to the method of embodiments has a high crystal quality, i.e. having a smooth surface, and few surface defects. This structure characteristic can reduce a light scattering to decrease an energy loss. Therefore, the fluoride phosphor powder can perform good external quantum efficiency, suitable for various products using a phosphor powder for increasing a luminous efficiency of a device.

In an embodiment, for example, the fluoride phosphor powder having a good luminescent property can be applied in various product devices, such as a display device, a light emitting device, etc., which can be realized as a thin type product device by utilizing the thin thickness structure of the fluoride phosphor powder.

Figure 2:
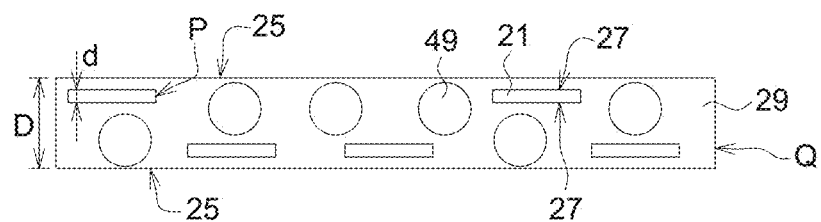
FIG. 2 illustrates a wavelength converting film according to an embodiment.

FIG. 2 illustrates a wavelength converting film 24 according to an embodiment. In embodiments, the wavelength converting film 24 comprises at least a sheet-like crystal 21 of the fluoride phosphor powder doped in a transparent base material 29. The wavelength converting film 24 may comprise a phosphor powder 49 of another kind doped therein, and mixed with the sheet-like crystal 21 of the fluoride phosphor powder, for adjusting a luminescent property according to a demand. The wavelength converting film 24 comprises a (upper or lower) flat film surface 25 perpendicular to the thickness direction of the wavelength converting film 24.

According to embodiments, the sheet-like crystal 21 of the fluoride phosphor powder having the thin thickness d is arranged in a manner that a (upper/lower) flat crystal surface 27 of the sheet-like crystal 21 faces toward the flat film surface 25 of the wavelength converting film 24, and/or the sidewall surface P between the upper and lower flat crystal surfaces 27 of the sheet-like crystal 21 of the fluoride phosphor powder faces toward a sidewall surface Q between the upper and lower flat film surfaces 25 of the wavelength converting film 24. Consequently, the sheet-like crystal 21 of the fluoride phosphor powder occupies a small thickness of the wavelength converting film 24 such that the wavelength converting film 24 can have a thin thickness D. Herein, the term "facing toward" is not limited to refer to a condition that the flat crystal surface 27 (or the sidewall surface P) is parallel to the flat film surface 25 (or the sidewall surface Q), and may be referred to another condition of a slight deviation from a parallel situation of the flat crystal surface 27 and the flat film surface 25. For example, an included angle between normal vectors of both the (upper) flat crystal surface 27 and the (upper) flat film surface 25 may be between 0 degree and 30 degrees, or between 0 degree and 15 degrees, or between 0 degree and 5 degrees, and so forth for the other surfaces. In embodiments, a higher parallel level between the flat crystal surface 27 and the flat film surface 25 (i.e. a condition more approaching to 0 degree of the included angle of the normal vectors of the two surfaces and to the sheet-like crystal 21 using the thickness d occupying the thickness D of the wavelength converting film 24) facilitate a greater thinness for the wavelength converting film 24. In an embodiment, the thickness D of the wavelength converting film 24 is 10 um-30 um, such as, 10 um-20 um.

The sheet-like crystal 21 of the fluoride phosphor powder may comprise the sheet-like crystal 11 as shown in FIG. 1, and/or comprise the sheet-like crystal of the fluoride phosphor powder having other polygonal shapes according to embodiments.

The phosphor powder 49 may comprise an inorganic phosphor material and/or an organic phosphor material. For example, a general inorganic phosphor material may comprise an aluminate phosphor powder (such as LuYAG, GaYAG, YAG, etc.), a silicate phosphor powder, a sulfide phosphor powder, a nitride phosphor powder, a fluoride phosphor powder, etc. The organic phosphor material may comprise a single molecule structure, a polymolecule structure, an oligomer, or a polymer. A compound of the organic phosphor material may comprise a group of perylene, a group of benzimidazole, a group of naphthalene, a group of anthracene, a group of phenanthrene, a group of fluorene, a group of 9-fluorenone, a group of carbazole, a group of glutarimide, a group of 1, 3-diphenylbenzene, a group of benzopyrene, a group of pyrene, a group of pyridine, a group of thiophene, a group of 2, 3-dihydro-1H-benzo[de]isoquinoline-1, 3-dione, a group of benzimidazole, or a combination thereof. For example, a yellow phosphor material such as YAG:Ce, and/or an inorganic yellow phosphor powder comprising a component of a oxynitride, a silicate or a nitride, and/or an organic yellow phosphor powder. Optionally, other kinds of red phosphor powders comprising (Sr, Ca)S:Eu, $(Ca,Sr)_2Si_5N_8$:Eu, $CaAlSiN_3$:Eu, $(Sr,Ba)_3SiO_5$:Eu may be used.

The transparent base material 29 may comprise a transparent gel. The transparent gel may comprise a material comprising polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), epoxy, silicone, or a combination thereof, etc. The transparent base material 29 may comprise a glass material or a ceramic material.

In embodiments, the wavelength converting film comprising at least the sheet-like crystal of the fluoride phosphor powder according to embodiments can be applied in various product devices, together with a light emitting diode chip. In a device, the wavelength converting film is capable of being excited by a first light emitted from the light emitting diode chip to emit a second light having a wavelength different from a wavelength of the first light.

Figure 3:
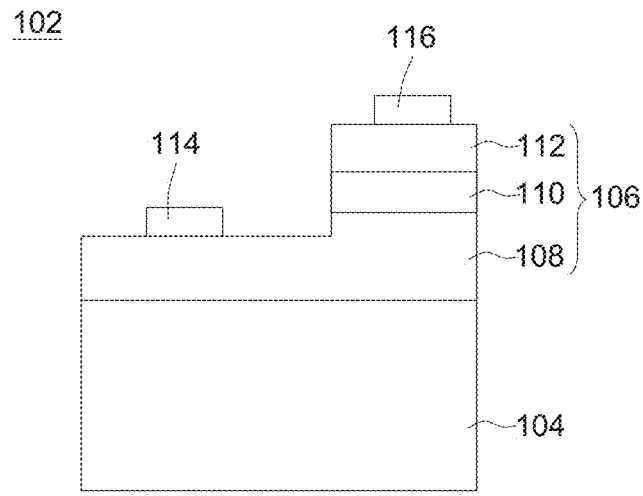
FIG. 3 illustrates a light emitting diode chip according to an embodiment.

FIG. 3 illustrates a light emitting diode chip 102 according to an embodiment. The light emitting diode chip 102 comprises a substrate 104, an epitaxial structure 106, a first electrode 114 and a second electrode 116. The epitaxial structure 106 comprises a first type semiconductor layer 108, an active layer 110 and a second type semiconductor layer 112 stacked from the substrate 104 in order. The first electrode 114 and the second electrode 116 are connected to the first type semiconductor layer 108 and the second type semiconductor layer 112 respectively. The substrate 104 may comprise an insulating material (such as a sapphire material) or a semiconductor material. The first type semiconductor layer 108 and the second type semiconductor layer 112 have opposing conductivity types. For example, the first type semiconductor layer 108 has an N-type semiconductor layer, while the second type semiconductor layer 112 has a P-type semiconductor layer, wherein the first electrode 114 is an N electrode, and the second electrode 116 is a P electrode. For example, the first type semiconductor layer 108 has a P-type semiconductor layer, while the second type semiconductor layer 112 has an N-type semiconductor layer, wherein the first electrode 114 is a P electrode, and the second electrode 116 is an N electrode. The light emitting diode chip 102 may be disposed in a face-up type manner or a flip-chip type manner. In an example relating to the flip-chip type manner, the light emitting diode chip 102 is placed upside down so that the first electrode 114 and the second electrode 116 face a base plate such as a circuit board and are bonded to contact pads through solders.

Figure 4:
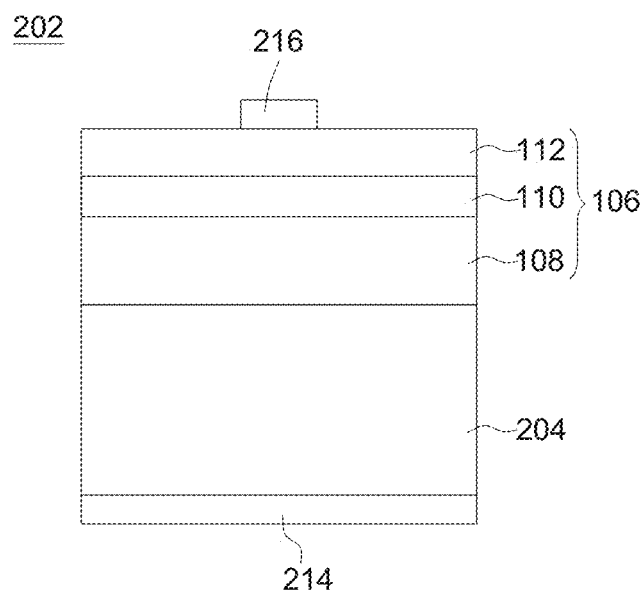
FIG. 4 illustrates a light emitting diode chip according to an embodiment.

FIG. 4 illustrates a light emitting diode chip 202 according to another embodiment. The light emitting diode chip 202 is a vertical light emitting diode chip. The light emitting diode chip 202 comprises a substrate 204 and the epitaxial structure 106. The epitaxial structure 106 comprises the first type semiconductor layer 108, the active layer 110 and the second type semiconductor layer 112 stacked from the substrate 204 in order. A first electrode 214 and a second electrode 216 are connected to the substrate 204 and the second type semiconductor layer 112 respectively. The material of substrate 204 comprises a metal, an alloy, a conductive, a semiconductor, or a combination thereof. The substrate 204 may comprise a semiconductor material having a conductivity type same with a conductivity type of the first type semiconductor layer 108; or a conductive material capable of forming an Ohmi contact to the first type semiconductor layer 108, such as a metal, etc. For example, the first type semiconductor layer 108 has an N-type semiconductor layer, while the second type semiconductor layer 112 has a P-type semiconductor layer, wherein the first electrode 214 is an N electrode, and the second electrode 216 is a P electrode. For example, the first type semiconductor layer 108 has a P-type semiconductor layer, while the second type semiconductor layer 112 has an N-type semiconductor layer, wherein the first electrode 214 is a P electrode, and the second electrode 216 is an N electrode. In an embodiment, the P-type semiconductor layer may be a P-type GaN material, and the N-type semiconductor layer may be an N-type GaN material. The active layer 110 has a multiple quantum well structure.

In an embodiment, the first light emitted from the light emitting diode chip 102, 202 has a wavelength of about 220 nm to 480 nm. In an embodiment, the light emitting diode chip 102, 202 may be the UV light emitting diode chip capable of emitting the first light having a wavelength of about 200 nm to 400 nm. In an embodiment, the light emitting diode chip 102, 202 may be the blue light emitting diode chip capable of emitting the first light having a wavelength of about 430 nm to 480 nm.

Figure 5:
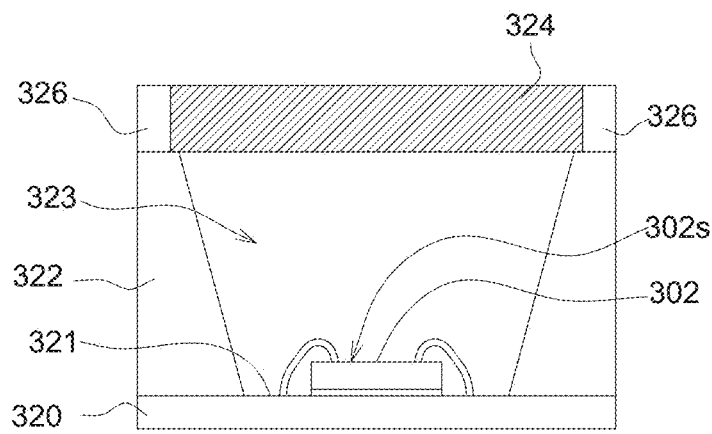
FIG. 5 illustrates a light emitting diode package structure according to an embodiment.

FIG. 5 illustrates a light emitting diode package structure 318 according to an embodiment. The light emitting diode package structure 318 comprises a light emitting diode chip 302, a base 320, a wavelength converting film 324 and a reflective wall 326. The base 320 has a die bonding region 321 and a wall 322 surrounding the die bonding region 321 and defining a receiving space 323. The light emitting diode chip 302 is disposed in the receiving space 323, and may be attached on the die bonding region 321 of the base 320 through an adhesive, and may be electrically connected to the base 320 through a wire bonding method. The wavelength converting film 324 is disposed over the receiving space 323 corresponding to a light emitting surface 302s of the light emitting diode chip 302, and disposed on a top surface of the wall 322. The reflective wall 326 may be disposed to surround an outer side wall of the wavelength converting film 324 and on the top surface of the wall 322. The reflective wall 326 may comprise a material having a light-reflective characteristic and a low light leakage, such as a reflective glass, a quartz, a light-reflection attaching sheet, a polymer plastic material or other suitable materials. The polymer plastic material may comprise polymethyl methacrylate (PMMA), polyethylene terephthalate (PET), polystyrene (PS), polypropylene (PP), polyamide (PA), polycarbonate (PC), epoxy, silicone, etc., or a combination thereof. The light reflectivity of the reflective wall 326 may be adjusted by adding an additional filler particle. The filler particle may be a composite material formed by materials having different particle diameters or different materials. For example, the material for the filler particle may comprise $TiO_2$, $SiO_2$, $Al_2O_3$, BN, ZnO, etc. This concept may be applied for other embodiments, and will not be explained again. In the embodiment, the light emitting diode chip 302 is spaced apart from the wavelength converting film 324 by an air gap in the receiving space 323 defined by the wall 322. For example, no substance of liquid or solid state is filled into the receiving space 323 to contact the light emitting diode chip 302.

In some embodiments, the wavelength converting film 324 and the light emitting diode chip 302 are separated from each other (by the receiving space 323 in this example), preventing the wavelength converting film 324 from being close to the light emitting diode chip 302. Therefore, the wavelength converting film 324 can have desired heat stability and chemical stability that would be affected by the light emitting diode chip 302. In addition, lifespan of the wavelength converting film 324 can be prolonged. Product reliability of a light emitting diode package structure can be increased. The similar concept will not be repeated hereafter.

In other transformable embodiments, the air gap of the receiving space 323 defined by the wall 322 may be filled with a transparent encapsulation gel (not shown). The transparent encapsulation gel may comprise polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), an epoxy, silicone, etc., or a combination thereof, or other suitable materials. In some embodiments, the transparent encapsulation gel may be doped with one or more kinds of the wavelength-converting materials. In other transformable embodiments, one or more kinds of the wavelength-converting materials may be coated on a light emitting surface of the light emitting diode chip 302. Therefore, in addition to the wavelength converting film 324, an emission characteristic of a light emitting diode package structure may also be adjusted by the (transparent) encapsulating compound with the wavelength-converting material doped in the (transparent) encapsulation gel and/or be adjusted by a coated layer comprising the wavelength-converting material on the light emitting surface of the light emitting diode chip 302. The wavelength-converting material of the encapsulation gel and/or the coated layer may comprise the sheet-like crystal of the fluoride phosphor powder according to embodiments and/or other kinds of phosphor powders. Kinds of the wavelength-converting materials of the wavelength converting film 324, and/or the encapsulation gel and/or the coated layer may be adjusted properly according actual demands for products. In an embodiment, for example, the wavelength converting film 324 may be the wavelength converting film 24 as illustrated referring to FIG. 2. Therefore, the wavelength converting film 324 can achieve a good luminous efficiency. In addition, since the wavelength converting film 24 can have a thin thickness, the light emitting diode package structure 318 can be realized as having a small height. The similar concept can be applied to other embodiments and will not be repeated hereafter.

Figure 6:
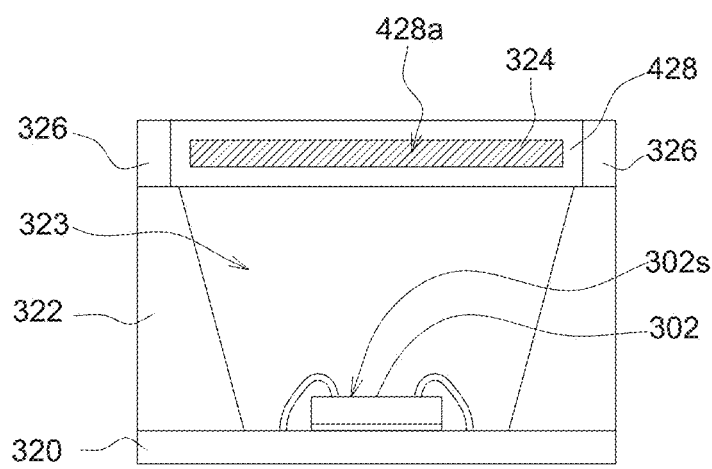
FIG. 6 illustrates a light emitting diode package structure according to an embodiment.

FIG. 6 illustrates a light emitting diode package structure 418 according to an embodiment. Differences between the light emitting diode package structure 418 and the light emitting diode package structure 318 shown in FIG. 5 are disclosed as the following. The light emitting diode package structure 418 may further comprise a structural element 428 for supporting, packaging or protecting the wavelength converting film 324. As shown in the figure, the structural element 428 has a receiving region 428a for receiving the wavelength converting film 324 therein and covering upper, lower surfaces of the wavelength converting film 324. The structural element 428 is disposed the top surface of the wall 322 so as to support the wavelength converting film 324 to be above the receiving space 323 corresponding to the light emitting surface 302s of the light emitting diode chip 302. The structural element 428 may be formed by a transparent material or a light transmissive material, to avoid blocking light emitting from the wavelength converting film 324. The structural element 428 may have a characteristic as an encapsulating material. For example, the structural element 428 may comprise quartz, glass, polymer plastic material, etc. Otherwise, the structural element 428 may be used for protecting the wavelength converting film 324 from a foreign substance that would disadvantageously affect a property of the wavelength converting film 324, such as moisture, oxygen gas, etc. In embodiments, the structural element 428 may a barrier film and/or a silicon titanium oxide disposed on a surface of the wavelength converting film 324 to avoid the foreign substance such as moisture, oxygen gas, etc. The silicon titanium oxide may comprise glass material such as $SiTiO_4$, etc., having a light transmissive characteristic and an antioxidative property, and may be disposed on the surface of the wavelength converting film 324 by a coating method or a sticking method as a film. The barrier film may comprise an inorganic material, such as a metal/metalloid oxide (such as $SiO_2$, $Al_2O_3$, etc.) or a metal/metalloid nitride (such as $Si_3N_3$, etc.). The barrier film may be a multi-layer barrier film disposed on the surface of the wavelength converting film 324 by a coating method or a sticking method as a film. The similar concept can be applied to other embodiments and will not be repeated hereafter. The reflective wall 326 may be disposed to surround an outer side wall of the structural element 428 and on the top surface of the wall 322.

Figure 7:
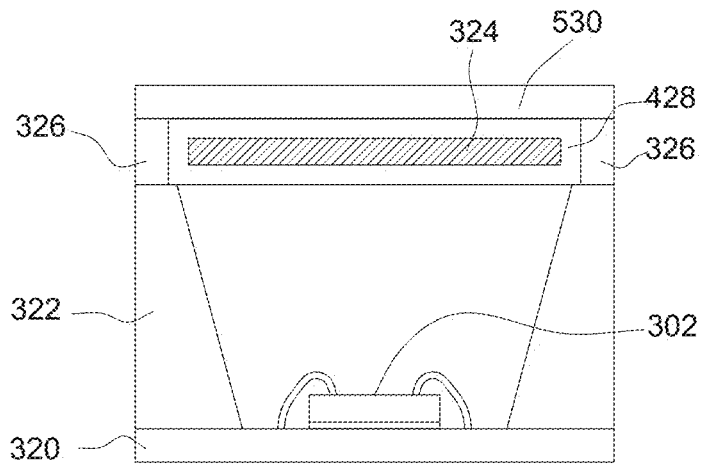
FIG. 7 illustrates a light emitting diode package structure according to an embodiment.

FIG. 7 illustrates a light emitting diode package structure 518 according to an embodiment. Differences between the light emitting diode package structure 518 and the light emitting diode package structure 418 shown in FIG. 6 are disclosed as following. The light emitting diode package structure 518 further comprises an optical layer 530 disposed on the reflective wall 326 and the structural element 428. The optical layer 530 may be used for adjusting a path of an emitting light. For example, the optical layer 530 may be a transparent gel with diffusion particles therein. The transparent gel comprise one or more of polymethyl methacrylate (PMMA), polyethylene terephthalate (PET), polystyrene (PS), polypropylene (PP), polyamide (PA), polycarbonate (PC), polyimide (PI), polydimethylsiloxane (PDMS), an epoxy, silicone, etc., and a combination thereof, etc. The diffusion particles may comprise $TiO_2$, $SiO_2$, $Al_2O_3$, BN, ZnO, etc. The diffusion particles may have uniform or various diameters. The similar concept can be applied to other embodiments and will not be repeated hereafter. For example, the optical layer 530 may be disposed on the wavelength converting film 324 for adjusting a path of an emitting light for an application of the light emitting diode package structure 318 in FIG. 5, the light emitting diode package structure 618 in FIG. 8, the light emitting diode package structure 1018 in FIG. 10, or other structures, etc.

Figure 8:
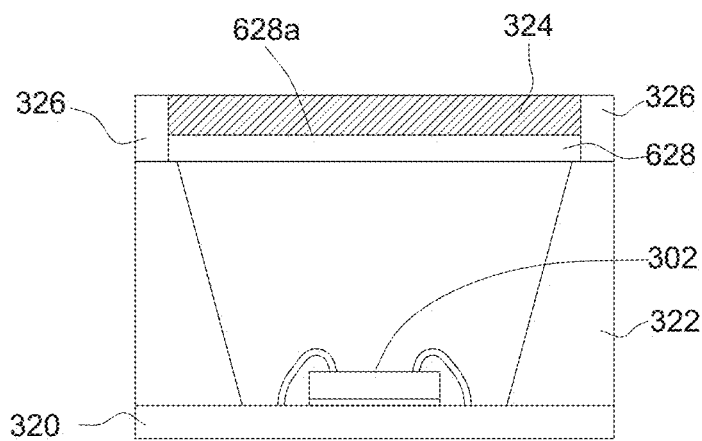
FIG. 8 illustrates a light emitting diode package structure according to an embodiment.

FIG. 8 illustrates a light emitting diode package structure 618 according to an embodiment. Differences between the light emitting diode package structure 618 and the light emitting diode package structure 318 shown in FIG. 5 are disclosed as following. The light emitting diode package structure 618 further comprises a structural element 628 having a receiving region 628a for receiving and supporting the wavelength converting film 324 across the light emitting diode chip 302 and disposed on the wall 322. The structural element 628 on the lower surface of the wavelength converting film 324 may be formed by a transparent material or a light transmissive material, to avoid blocking light emitting from the wavelength converting film 324. For example, the structural element 628 may comprise quartz, a glass, a polymer plastic material, or other suitable materials. The similar concept can be applied to other embodiments and will not be repeated hereafter.

Figure 9:
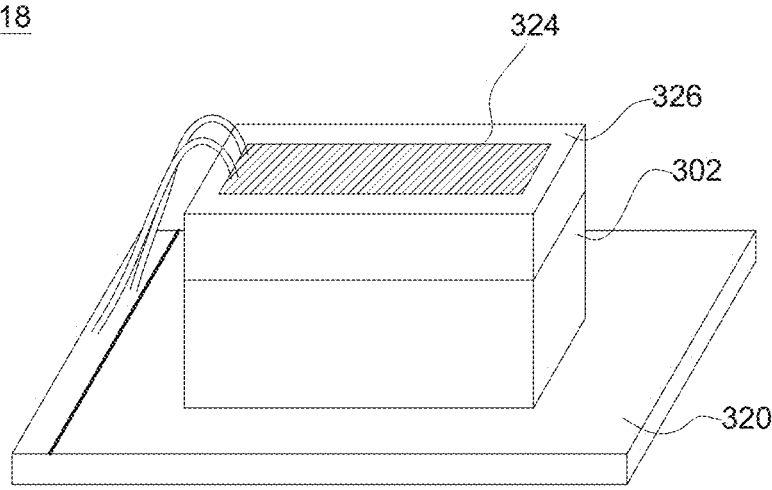
FIG. 9 illustrates a light emitting diode package structure according to an embodiment.

FIG. 9 illustrates a light emitting diode package structure 918 according to an embodiment. The light emitting diode package structure 918 comprises the base 320, the light emitting diode chip 302, the wavelength converting film 324 and the reflective wall 326. The light emitting diode chip 302 is disposed on the die bonding region of the base 320. The wavelength converting film 324 is disposed on the light emitting surface of the light emitting diode chip 302. The reflective wall 326 is disposed on a side wall of the wavelength converting film 324. The light emitting diode chip 302 may be electrically connected to the base 320 by a wire bonding passing through an opening (not shown) of the wavelength converting film 324.

Figure 10:
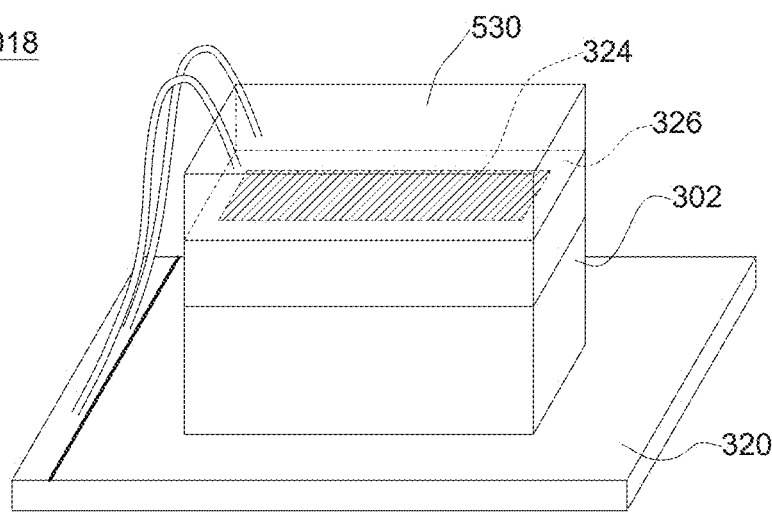
FIG. 10 illustrates a light emitting diode package structure according to an embodiment.

FIG. 10 illustrates a light emitting diode package structure 1018 according to an embodiment. Differences between the light emitting diode package structure 1018 and the light emitting diode package structure 918 shown in FIG. 9 are disclosed as following. The light emitting diode package structure 1018 further comprises the optical layer 530 disposed on the wavelength converting film 324 and the reflective wall 326. The light emitting diode chip 302 may be electrically connected to the base 320 by a wire bonding passing through an opening (not shown) of the wavelength converting film 324 and the optical layer 530. The wire bonding may be pulled out through an upper surface or a side surface of the optical layer 530.

Figure 11:
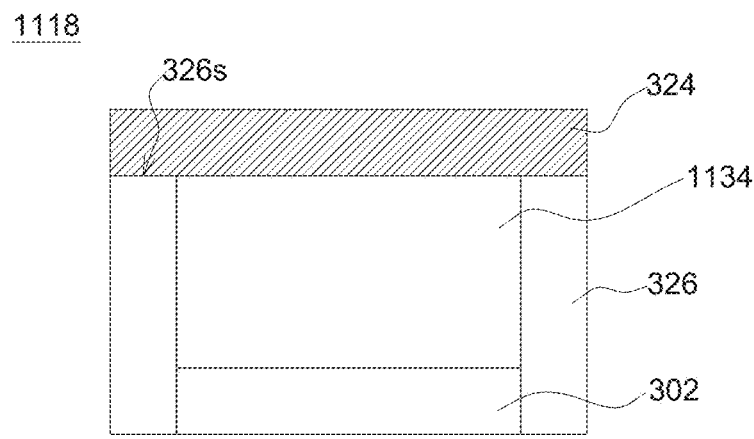
FIG. 11 illustrates a light emitting diode package structure according to an embodiment.

FIG. 11 illustrates a light emitting diode package structure 1118 according to an embodiment. The light emitting diode package structure 1118 comprises the light emitting diode chip 302, the wavelength converting film 324 and the reflective wall 326. The reflective wall 326 surrounds the side wall of the light emitting diode chip 302 and defines a spaced vacancy 1134. The reflective wall 326 is higher than the light emitting diode chip 302. The wavelength converting film 324 is disposed on a top surface 326s of the reflective wall 326. The wavelength converting film 324 and the light emitting diode chip 302 are separated from each other by the spaced vacancy 1134 with a gap distance, preventing the wavelength converting film 324 from being close to the light emitting diode chip 302. Therefore, the wavelength converting film 324 can have desired heat stability and chemical stability that would be affected by the light emitting diode chip 302. In addition, lifespan of the wavelength converting film 324 can be prolonged. Product reliability of a light emitting diode package structure can be increased. The similar concept will not be repeated hereafter.

Figure 12:
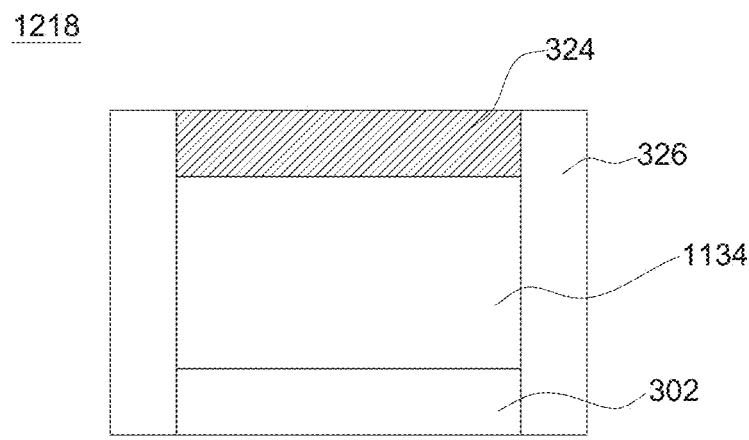
FIG. 12 illustrates a light emitting diode package structure according to an embodiment.

FIG. 12 illustrates a light emitting diode package structure 1218 according to an embodiment. The light emitting diode package structure 1218 is different from the light emitting diode package structure 1118 shown in FIG. 11 in that the wavelength converting film 324 is disposed on an inner side wall of the reflective wall 326.

Figure 13:
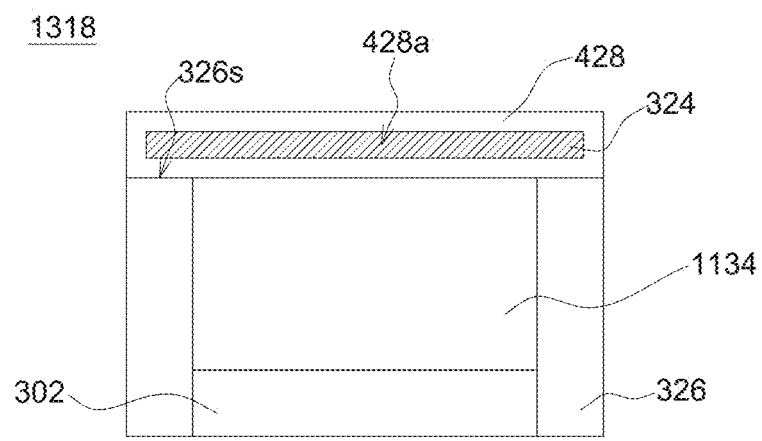
FIG. 13 illustrates a light emitting diode package structure according to an embodiment.

FIG. 13 illustrates a light emitting diode package structure 1318 according to an embodiment. Differences between the light emitting diode package structure 1318 and the light emitting diode package structure 1118 shown in FIG. 11 are disclosed as following. The light emitting diode package structure 1318 further comprises the structural element 428 with the wavelength converting film 324 disposed in the receiving region 428a defined by the structural element 428, for supporting, packaging or protecting the wavelength converting film 324. The structural element 428 covering the wavelength converting film 324 is disposed on the top surface 326s of the reflective wall 326 to space apart from the light emitting diode chip 302 with the spaced vacancy 1134. The structural element 428 may be formed by a transparent material or a light transmissive material, to avoid blocking light emitting from the wavelength converting film 324. The structural element 428 may have a characteristic as an encapsulating material. For example, the structural element 428 may comprise a quartz, a glass, a polymer plastic material, etc. Otherwise, the structural element 428 may be used for protecting the wavelength converting film 324 from a foreign substance that would disadvantageously affect a property of the wavelength converting film 324, such as moisture, oxygen gas, etc. In embodiments, the structural element 428 may a barrier film and/or a silicon titanium oxide disposed on the surface of the wavelength converting film 324 to avoid the foreign substance such as moisture, oxygen gas, etc. The silicon titanium oxide may comprise a glass material such as $SiTiO_4$, etc., having a light transmissive characteristic and an antioxidative property, and may be disposed on the surface of the wavelength converting film 324 by a coating method or a sticking method as a film. The barrier film may comprise an inorganic material, such as a metal/metalloid oxide (such as $SiO_2$, $Al_2O_3$, etc.) or a metal/metalloid nitride (such as $Si_3N_3$, etc.). The barrier film may be a multi-layer barrier film disposed on the surface of the wavelength converting film 324 by a coating method or a sticking method as a film.

In an embodiment, the spaced vacancy 1134 may be an empty space not filled with a substance of liquid or solid state. The spaced vacancy 1134 may be formed by a transparent material or a light transmissive material, to avoid blocking light emitting from the wavelength converting film 324. For example, the spaced vacancy 1134 may comprise a quartz, a glass, a polymer plastic material, or other suitable materials.

In embodiments, the light emitting diode package structure 318, 418, 518, 618, 918, 1018, 1118, 1218, 1318 emits a white light. In some embodiments, for example, the light emitting diode chip 302 may be a blue light emitting diode chip. In this case, the wavelength converting film 324 comprises the red fluoride phosphor powder $A_2[MF_6]:Mn^{4+}$ with the $Mn^{4+}$ as the activator and having the sheet-like crystal according to embodiments and the yellow phosphor powder. Alternatively, the wavelength converting film 324 comprises the red fluoride phosphor powder $A_2[MF_6]:Mn^{4+}$ with the $Mn^{4+}$ as the activator and having the sheet-like crystal according to embodiments and the green phosphor powder. In another embodiment, the light emitting diode chip 302 may be a UV light emitting diode chip. In this case, the wavelength converting film 324 comprises the red fluoride phosphor powder $A_2[MF_6]:Mn^{4+}$ with the $Mn^{4+}$ as the activator and having the sheet-like crystal according to embodiments, the green phosphor powder and the blue phosphor powder. The red fluoride phosphor powder $A_2[MF_6]:Mn^{4+}$ with the $Mn^{4+}$ as the activator and having the sheet-like crystal according to embodiments emits a red light having a peak wavelength in a range of about 600 nm to about 650 nm after being excited by a light having a peak wavelength in a range of about 300 nm to about 470 nm.

Figure 14:
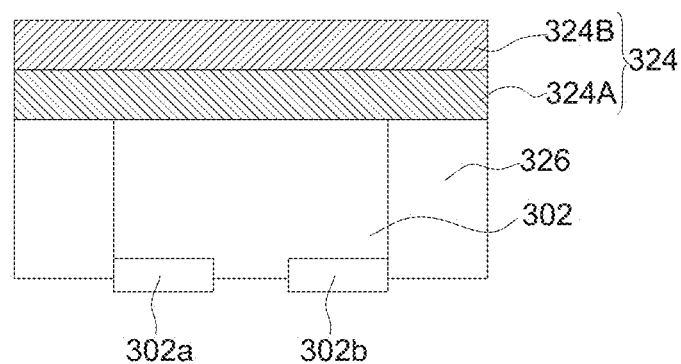
FIG. 14 illustrates a light emitting diode package structure according to an embodiment.

FIG. 14 illustrates a light emitting diode package structure 1418 according to an embodiment. The light emitting diode package structure 1418 comprises the light emitting diode chip 302, the reflective wall 326 and the wavelength converting film 324. The reflective wall 326 is disposed on the side surface of the light emitting diode chip 302. The wavelength converting film 324 is disposed on the upper surface (light emitting surface) of the light emitting diode chip 302. The wavelength converting film 324 may comprise a first wavelength converting film 324A and a second wavelength converting film 324B having different characteristics from each other. In an embodiment, for example, the first wavelength converting film 324A comprises the red fluoride phosphor powder $A_2[MF_6]:Mn^{4+}$ with the $Mn^{4+}$ as the activator and having the sheet-like crystal according to embodiments, and the second wavelength converting film 324B comprises the green phosphor powder. The light emitting diode chip 302 may be electrically connected to a base or a circuit board (not shown) with a first electrode 302a and a second electrode 302b by a flip chip method.

Figure 15:
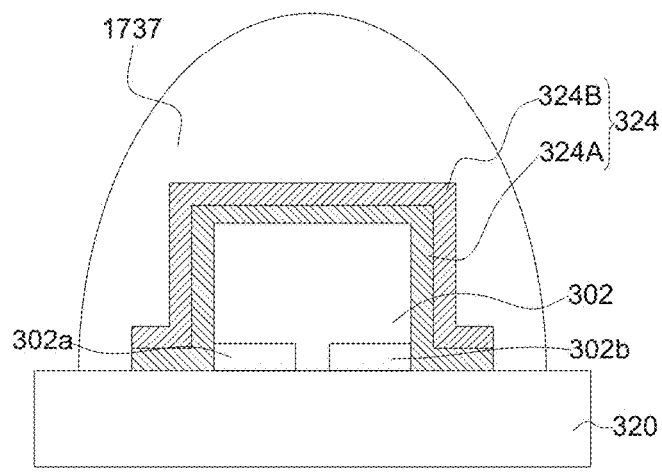
FIG. 15 illustrates a light emitting diode package structure according to an embodiment.

FIG. 15 illustrates a light emitting diode package structure 1718 according to an embodiment. The light emitting diode package structure 1718 comprises the base 320, the light emitting diode chip 302, the wavelength converting film 324 and a transparent gel 1737. The light emitting diode chip 302 is electrically connected to the base 320 by a flip chip method. The wavelength converting film 324 is disposed on the upper surface and the side surface of the light emitting diode chip 302, and may be extended onto the upper surface of the base 320. In an embodiment, for example, the first wavelength converting film 324A comprises the red fluoride phosphor powder $A_2[MF_6]:Mn^{4+}$ with the $Mn^{4+}$ as the activator and having the sheet-like crystal according to embodiments, and the second wavelength converting film 324B comprises the green phosphor powder. The transparent gel 1737 may be used as an encapsulation gel to cover the wavelength converting film 324 and the base 320.

Figure 16:
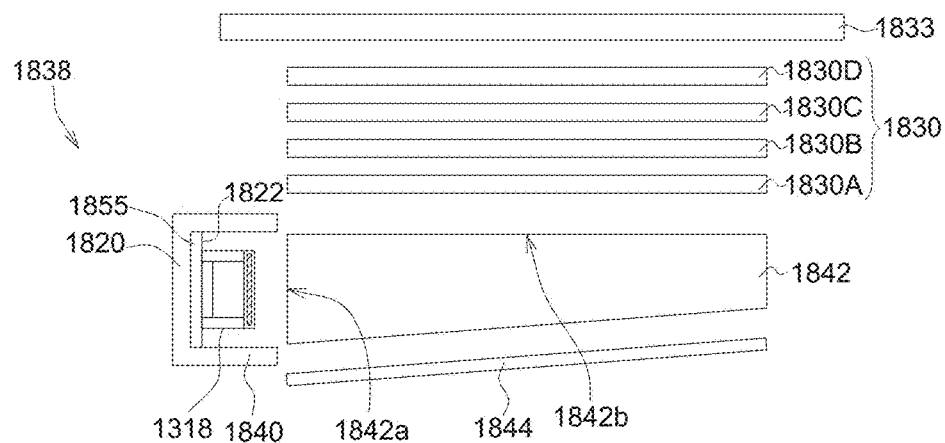
FIG. 16 illustrates a display device according to an embodiment.

FIG. 16 illustrates a display device 1839 according to an embodiment. The display device 1839 comprises a side type back light module 1838, a display panel 1833 and an optical layer 1830 disposed between the side type back light module 1838 and the display panel 1833. The side type back light module 1838 comprises a frame 1820, a light source 1822, a light guide plate 1842. The light source 1822 comprises a circuit board 1855 on the frame 1820, and a plurality of the light emitting diode package structures 1318 as illustrated with FIG. 13 on the circuit board 1855. The light emitting surface of the light emitting diode package structure 1318 faces toward a light incident surface 1842a of the light guide plate 1842. The frame 1820 comprises a reflective sheet 1840. The reflective sheet 1840 can help focusing a light emitted from the light emitting diode package structure 1318 toward the light guide plate 1842. The light emitted from a light emitting surface 1842b of the light guide plate 1842 goes upward an optical layer 1830 and the display panel 1833. For example, the optical layer 1830 may comprise an optical layer 1830A, an optical layer 1830B, an optical layer 1830C, and an optical layer 1830D. For example, the optical layer 1830A and the optical layer 1830D may be diffusion sheets. The optical layer 1830B and the optical layer 1830C may be brightness-enhancement sheets. A reflective sheet 1844 may be disposed under the light guide plate 1842 to direct a light upward to the optical layer 1830A, the optical layer 1830B, the optical layer 1830C, the optical layer 1830D (or a display panel, not shown). In embodiments, the side type back light module is not limited to using the light emitting diode package structure 1318 in FIG. 13. The light emitting diode package structure disclosed in other embodiments may be used.

Figure 17:
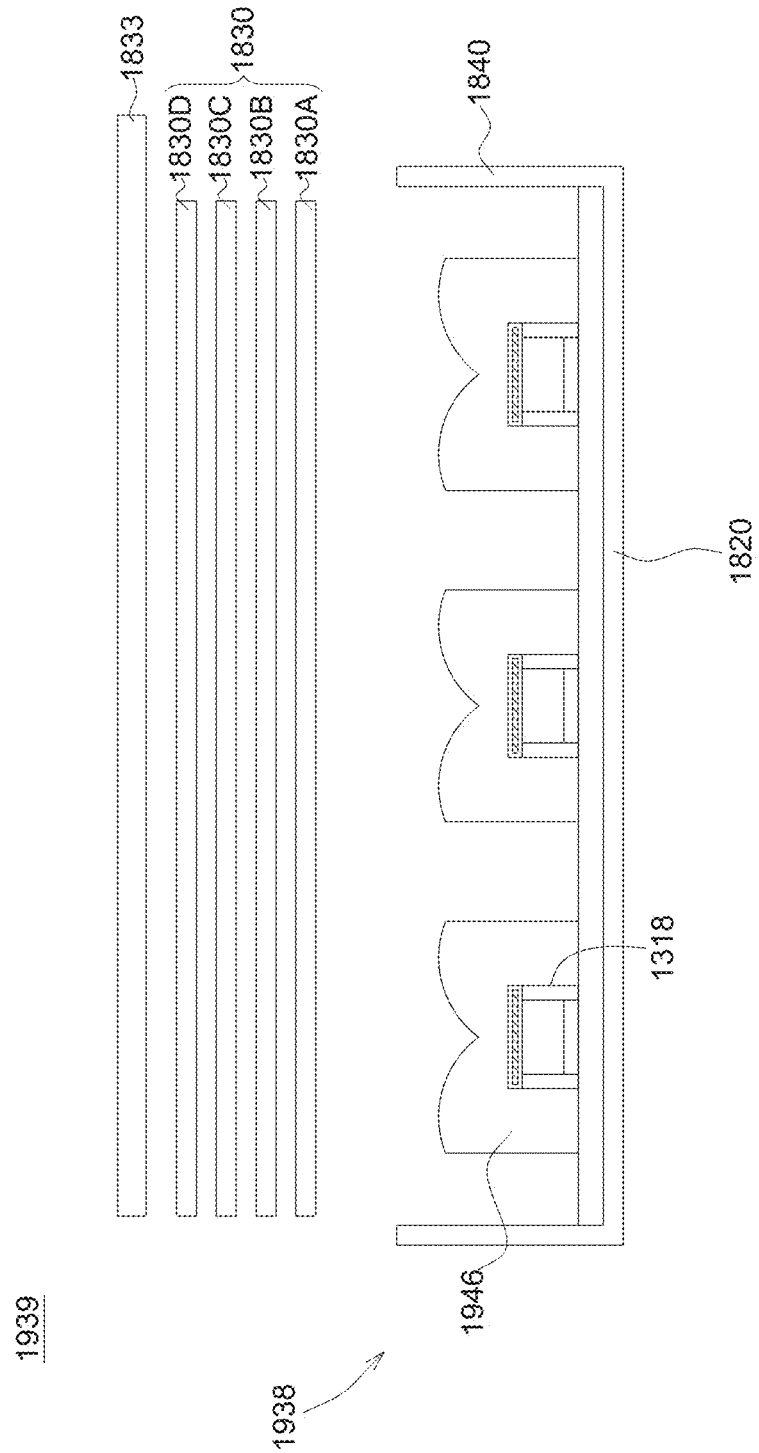
FIG. 17 illustrates a display device according to an embodiment.

FIG. 17 illustrates a display device 1939 according to an embodiment, which is different from the display device 1839 in FIG. 16 in that the display device 1939 uses a direct type back light module 1938. The direct type back light module 1938 comprises a secondary optical element 1946 on the light emitting diode package structure 1318. The light emitting surface of the light emitting diode package structure 1318 faces toward the optical layer 1830. The reflective sheet 1840 can help focusing a light emitted from the light emitting diode package structure 1318 toward the optical layer 1830 (or a display panel). In embodiments, the direct type back light module is not limited to using the light emitting diode package structure 1318 shown in FIG. 13. The light emitting diode package structure disclosed in other embodiments may be used.

According to embodiments, the light module of the display device uses the wavelength converting film having the thin thickness, and therefore the display device can be designed as a thin type device.

The fluoride phosphor powder according to embodiments is not limited to an application of the foregoing light emitting device or device, and may be applied for other products using a phosphor powder. For example, the fluoride phosphor powder according to embodiments may be applied in a wavelength converting element, a photovoltaic conversion device, such as a light emitting diode package, a quantum dot light emitting diode (QLED), a plant illumination device, a solar cell, a bio label, an image sensor, etc.

A number of embodiments are disclosed below to provide detailed descriptions of the disclosure.

《《$K_2[TiF_6]$:$Mn^{4+}$ phosphor powder》》

The first solution was obtained by mixing and stirring 1.4 g of $KHF_2$, 0.05 g of a solution containing 2-8% of $K_2MnF_6$, and 6-12 ml of HF at the temperature of 0-50° C. for 15 minutes.

The second solution was obtained by mixing and stirring 2.2 ml of 1-propanol and 2 ml of titanium isopropoxide at the room temperature for 15 minutes.

Next, the first solution and the second solution were mixed and stirred at 0° C. for 15 minutes. The mixture was washed with ethanol twice, and then washed with acetone once. Next, the washed mixture was dried with using the oven at 50° C. for 2 hours to obtain $K_2[TiF_6]$:$Mn^{4+}$ phosphor powder.

Table 1 lists the results of the obtained $K_2[TiF_6]$:$Mn^{4+}$ phosphor powder, comprising the crystal flat surface (a), the thickness (d), the a/d value, the internal quantum efficiency (IQE), the absorption (Abs), the external quantum efficiency (EQE), and the corresponding SEM images figures. It can be found from the table 1, the phosphor powders having the sheet-like crystal complying with 2.5<a/d≤100 in Embodiments 3 to 6 have a higher external quantum efficiency than the phosphor powders having a bulk shape crystal (a/d=1) and an approximate bulk shape crystal (a/d=2) in Comparative examples 1 and 2.

TABLE 1

Figure 18:
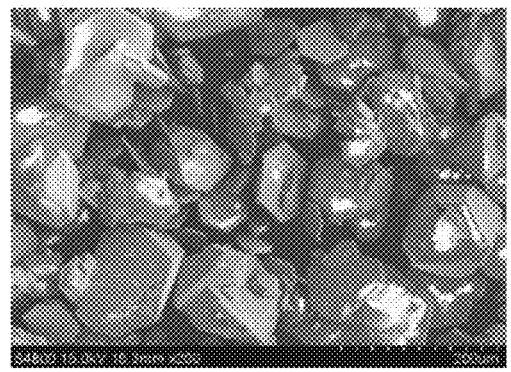
FIG. 18 is a SEM image figure of a phosphor powder having a bulk shape crystal in a comparative example.
Figure 19:
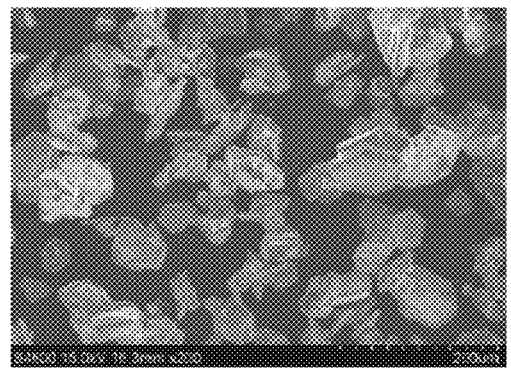
FIG. 19 is a SEM image figure of a phosphor powder having an approximate bulk shape crystal in a comparative example.
Figure 20:
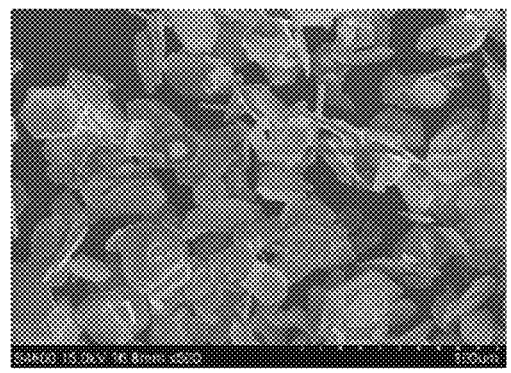
FIG. 20 is a SEM image figure of a phosphor powder having a sheet-like crystal in an embodiment.
Figure 21:
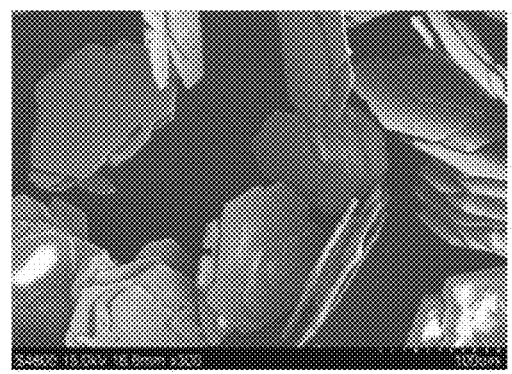
FIG. 21 is a SEM image figure of a phosphor powder having a sheet-like crystal in an embodiment.
Figure 22:
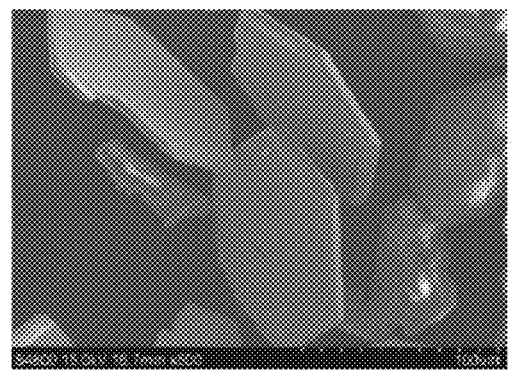
FIG. 22 is a SEM image figure of a phosphor powder having a sheet-like crystal in an embodiment.
Figure 23:
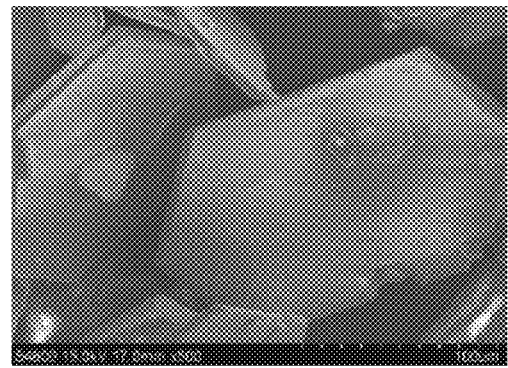
FIG. 23 is a SEM image figure of a phosphor powder having a sheet-like crystal in an embodiment.

|  | a [um] | d [um] | a/d | IQE [%] | Abs [%] | EQE [%] | SEM |
|---|---|---|---|---|---|---|---|
| Comparative example 1 | 80 | 80 | 1 | 75.6 | 64.0 | 48.4 | FIG. 18 |
| Comparative example 2 | 60 | 40 | 2 | 68.9 | 74.4 | 51.3 | FIG. 19 |
| Embodiment 3 | 30 | 3 | 10 | 92.2 | 61.7 | 56.8 | FIG. 20 |
| Embodiment 4 | 100 | 3 | 33 | 87.2 | 77.3 | 67.4 | FIG. 21 |
| Embodiment 5 | 100 | 10 | 10 | 90.5 | 78.8 | 71.3 | FIG. 22 |
| Embodiment 6 | 150 | 10 | 15 | 93.2 | 75.6 | 70.4 | FIG. 23 |

According to the foregoing embodiments, the fluoride phosphor powder with the $Mn^{4+}$ as the activator and having the sheet-like crystal has a good luminescent property and a thin thickness, and thus can be applied for various devices for improving the luminescent efficiency and facilitating miniaturizing a product.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A wavelength converting film, comprising a fluoride phosphor powder with a $Mn^{4+}$ as an activator, wherein the fluoride phosphor powder with the $Mn^{4+}$ as the activator comprises a sheet-like crystal and has a chemical formula of $A_2[MF_6]$:$Mn^{4+}$, and wherein A is Li, Na, K, Rb, Cs, $NH_4$, or a combination thereof, and M is Ge, Si, Sn, Ti, Zr, or a combination thereof, wherein the sheet-like crystal of the fluoride phosphor powder with the $Mn^{4+}$ as the activator has a thickness d, a crystal flat surface of the sheet-like crystal has a maximum length a, wherein the maximum length a is defined as a distance between two end points on an edge of the crystal flat surface and farthest from each other, and 2.5<a/d≤100.

2. The wavelength converting film according to claim 1, wherein the fluoride phosphor powder with the $Mn^{4+}$ as the activator emits a red light having a peak wavelength in a range of 600 nm-650 nm after being excited by a light having a peak wavelength in a range of 300 nm-470 nm.

3. The wavelength converting film according to claim 1, wherein the fluoride phosphor powder with the $Mn^{4+}$ as the activator has a chemical formula of $K_2[TiF_6]$:$Mn^{4+}$.

4. The wavelength converting film according to claim 1, wherein the sheet-like crystal comprises another crystal flat surface substantially parallel to the crystal flat surface, wherein the crystal flat surface and the another crystal flat surface have the thickness d therebetween.

5. The wavelength converting film according to claim 1, wherein the crystal flat surface of the sheet-like crystal is perpendicular to a thickness direction, and a=5-200 um.

6. The wavelength converting film according to claim 1, wherein 8≤a/d≤35.

7. The wavelength converting film according to claim 1, wherein the sheet-like crystal has a polygonal crystal flat surface.

8. The wavelength converting film according to claim 1, wherein the wavelength converting film has a thickness of 10-30 um.

9. The wavelength converting film according to claim 8, wherein the thickness of the wavelength converting film is 10-20 um.

10. The wavelength converting film according to claim 1, wherein the wavelength converting film has a flat film surface perpendicular to a thickness direction of the wavelength converting film, the sheet-like crystal has a flat crystal surface perpendicular to a thickness direction of the sheet-like crystal, and the flat film surface faces toward the flat crystal surface.

11. A light emitting device, comprising:
a light emitting diode chip; and
a wavelength converting film being capable of being excited by a first light emitted from the light emitting diode chip to emit a second light having a wavelength different from a wavelength of the first light, wherein the wavelength converting film comprises a fluoride phosphor powder with a $Mn^{4+}$ as an activator, wherein the fluoride phosphor powder with the $Mn^{4+}$ as the activator comprises a sheet-like crystal and has a chemical formula of $A_2[MF_6]$:$Mn^{4+}$, wherein A is Li, Na, K, Rb, Cs, $NH_4$, or a combination thereof, and M is Ge, Si, Sn, Ti, Zr, or a combination thereof, wherein the sheet-like crystal of the fluoride phosphor powder with the $Mn^{4+}$ as the activator has a thickness d, a crystal flat surface of the sheet-like crystal has a maximum length a, wherein the maximum length a is defined as a distance between two end points on an edge of the crystal flat surface and farthest from each other, and $2.5 < a/d \leq 100$.

12. The light emitting device according to claim 11, wherein the wavelength converting film and the light emitting diode chip are contact with each other, or separated from each other.

13. The light emitting device according to claim 11, further comprising a transparent encapsulation gel encapsulating the wavelength converting film and the light emitting diode chip.

14. The light emitting device according to claim 11, further comprising a structural element configured as a structure selected from a group consisting of:
    the structural element having a receiving region for receiving the wavelength converting film so as to cover at least one of an upper surface and a lower surface of the wavelength converting film to support, encapsulate, and/or protect the wavelength converting film;
    the structural element being on the lower surface of the wavelength converting film and having the receiving region for receiving and supporting the wavelength converting film; and
    the structural element being on the upper surface of the wavelength converting film so as to protect the wavelength converting film.

15. The light emitting device according to claim 11, further comprising a base having a die bonding region in the base, wherein the light emitting diode chip is on the die bonding region.

16. The light emitting device according to claim 11, further comprising a reflective wall outside the wavelength converting film.

17. The light emitting device according to claim 11, which applied in a back light module or a lighting device.

18. A display device, comprising:
    a display panel; and
    a light module adjacent to the display panel, wherein the light module comprises:
    a light emitting diode chip; and
    a wavelength converting film being capable of being excited by a first light emitted from the light emitting diode chip to emit a second light having a wavelength different from a wavelength of the first light, wherein the wavelength converting film comprises a fluoride phosphor powder with a $Mn^{4+}$ as an activator, the fluoride phosphor powder with the $Mn^{4+}$ as the activator comprises a sheet-like crystal and has a chemical formula of $A_2[MF_6]:Mn^{4+}$, wherein A is Li, Na, K, Rb, Cs, $NH_4$, or a combination thereof, and M is Ge, Si, Sn, Ti, Zr, or a combination thereof, wherein the sheet-like crystal of the fluoride phosphor powder with the $Mn^{4+}$ as the activator has a thickness d, a crystal flat surface of the sheet-like crystal has a maximum length a, wherein the maximum length a is defined as a distance between two end points on an edge of the crystal flat surface and farthest from each other, and $2.5 < a/d \leq 100$.

19. The display device according to claim 18, wherein the light module is a back light module.

\* \* \* \* \*